United States Patent [19]
Ovens et al.

[11] Patent Number: 5,408,136
[45] Date of Patent: Apr. 18, 1995

[54] CIRCUIT FOR PROVIDING FAST LOGIC TRANSITIONS

[75] Inventors: Kevin M. Ovens, Garland; Jeffrey A. Niehaus, Dallas; Dale C. Earl, Garland, all of Tex.

[73] Assignee: Texas Instruments Incorporated, Dallas, Tex.

[21] Appl. No.: 55,401

[22] Filed: Apr. 30, 1993

Related U.S. Application Data

[63] Continuation of Ser. No. 423,061, Oct. 18, 1989, abandoned.

[51] Int. Cl.$^6$ ............................................. H03K 17/16
[52] U.S. Cl. .............................. 327/108; 327/170/374; 326/128; 326/56; 326/19
[58] Field of Search ............... 307/263, 443, 454, 456, 307/473, 270, 542, 546, 296.4

[56] References Cited

U.S. PATENT DOCUMENTS

| | | | |
|---|---|---|---|
| 4,486,674 | 12/1984 | Neely | 307/456 |
| 4,704,548 | 11/1987 | Strong et al. | 307/456 |
| 4,737,665 | 4/1988 | Ovens | 307/456 |
| 4,839,538 | 6/1989 | Curtis | 307/473 |
| 4,871,926 | 10/1989 | Neely et al. | 307/473 |
| 4,973,862 | 11/1990 | Luich et al. | 307/473 |

Primary Examiner—Margaret R. Wambach
Attorney, Agent, or Firm—Mark E. Courtney; Wade James Brady

[57] ABSTRACT

A TTL gate (26) with a Darlington output (14,14A,16) includes three circuits (28,30,32) to decrease the gate switching time during an output transition from a high to a low logic state and from a high impedance state to a low logic state. Each speedup circuit drives the gate input transistor (12) for a different length of time, ensuring that the lower output transistor (16) turns on rapidly and remains on until the output transition is complete. The circuits ensure, however, that the additional drive current (82) is time limited to avoid excessive power consumption.

46 Claims, 1 Drawing Sheet

CIRCUIT FOR PROVIDING FAST LOGIC TRANSITIONS

This application is a Continuation of application Ser. No. 07/423,061, filed Oct. 18, 1989, now abandoned.

TECHNICAL FIELD OF THE INVENTION

This invention relates in general to integrated circuits, and more particularly to a circuit which provides a fast output transition responsive to an input transition.

BACKGROUND OF THE INVENTION

In integrated circuit design, great emphasis is placed on the operating speed of the circuit. A "totem pole" output is often coupled to a transistor-transistor logic (TTL) gate to decrease the gate switching time.

In its most basic form, a TTL gate, with a totem pole output comprises an input transistor (also called a phase splitter) and two output transistors. The base of the phase splitter serves as the gate input and is coupled to the output of the previous gate. The collector of the phase splitter is coupled to the base of one output transistor (upper output transistor) and the emitter is coupled to the base of the second output transistor (lower output transistor). The emitter of the upper output transistor is coupled to the collector of the lower output transistor; this node serves as the gate output. Other circuit elements are used for biasing.

The phase splitter acts as a common emitter to the upper output transistor, turning it off when the input is high, and acts as an emitter follower to the lower output transistor, turning it off when the input is low. When the gate is in a high impedance state (3-state), both output transistors are off.

The output transistors of the TTL gate and the input transistors of the following gate contain certain capacitances which must be charged and discharged before the gate can switch. The upper output transistor acts as a current source to rapidly charge the capacitance and the lower output transistor acts as a current sink to rapidly discharge the capacitance. If the capacitance can be made to charge and discharge more rapidly, the overall speed of the gate can be increased.

Circuitry currently in existence for discharging the capacitance more rapidly (during a high to low output transition) generally depends on a diode or transistor between the collector of the phase splitter and the gate output. The diode feeds some of the output current back into the phase splitter which, in turn, forces more current to the lower output transistor to discharge the capacitance. A crucial disadvantage of this method and others is that the speedup circuits generally turn off when the output voltage is above the critical measuring voltage. Another disadvantage is that the additional current flowing into the base of the phase splitter continues even after it is no longer needed, causing a wasteful increase in the power required, especially at higher frequencies. Furthermore, speedup circuits suitable for use during a high to low logic state transition may not be suitable during a 3-state to low transition.

Therefore, a need has arisen to provide a circuit for increasing the speed of both the high to low output transition and the 3-state to low output transition without decreasing power efficiency.

SUMMARY OF THE INVENTION

In accordance with the present invention, an output circuit for providing a fast output transition responsive to an input transition is provided which substantially increases the operating speed of an output gate.

In the present invention, the output circuit comprises an output geometry operable to switch states responsive to an input transition. A first speedup circuit generates an impulse-like current of high magnitude and short duration for driving the output geometry responsive to the input transition and a second speedup circuit generates a timed current for driving the output geometry responsive to the input transition. A third speedup circuit is provided which produces a current for driving the output geometry responsive to the input transition. The third current also has lower magnitude and longer duration than the first.

In a second aspect of the present invention, an output circuit responsive to a transition at a 3-state input is provided which generates an impulse-like current to the output geometry responsive to a transition in the 3-state input. Upon transition to a low output logic state, a switching transistor turns on and allows a capacitive diode to discharge a current to the output. The current continues until the diode is fully discharged or until timing circuitry disables the switching transistor.

The output circuit of the present invention provides the technical advantage of producing a fast output transition while maintaining a low DC current drive.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
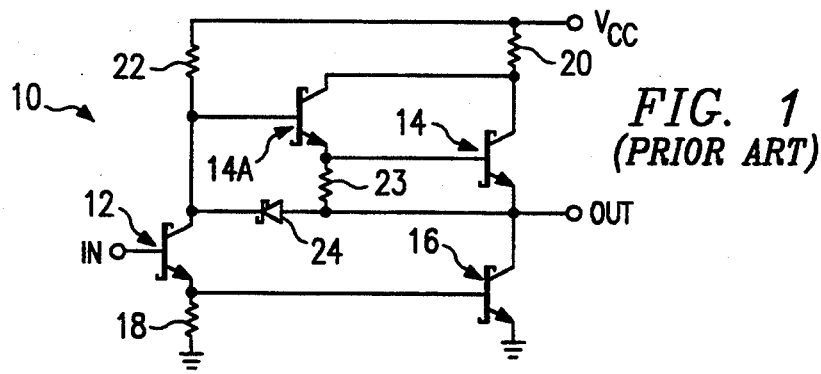
FIG. 1 illustrates a schematic representation of a prior art TTL circuit.
Figure 2:
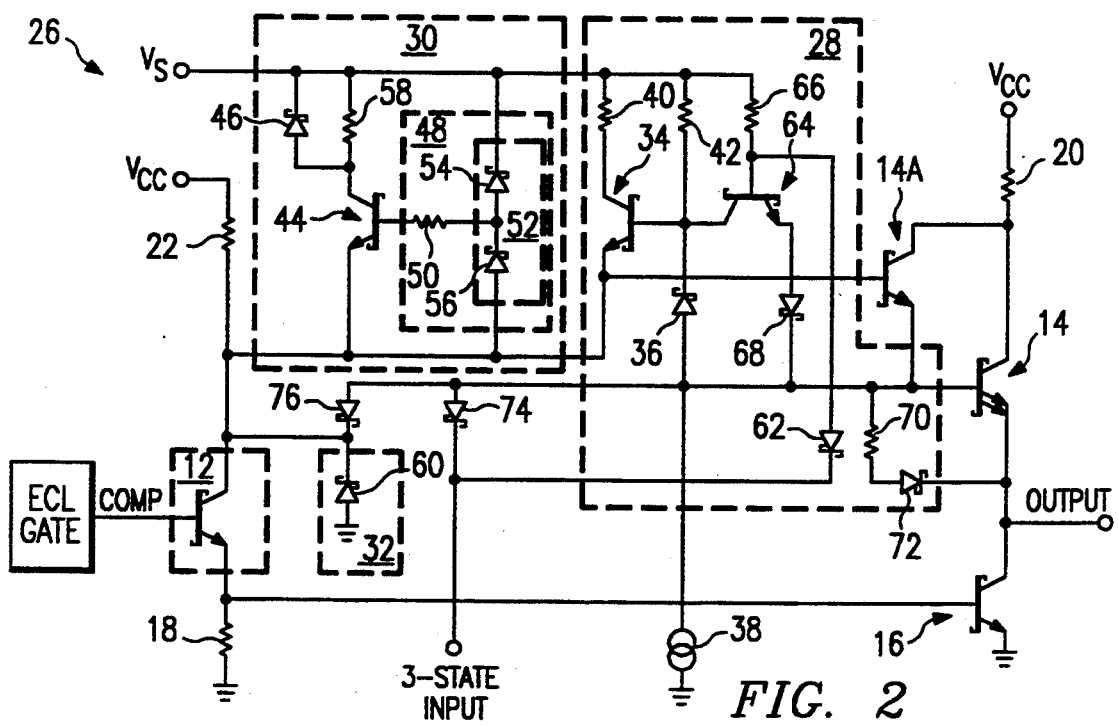
FIG. 2 illustrates a schematic representation of a TTL gate using the speedup circuits of the present invention.
Figure 3:
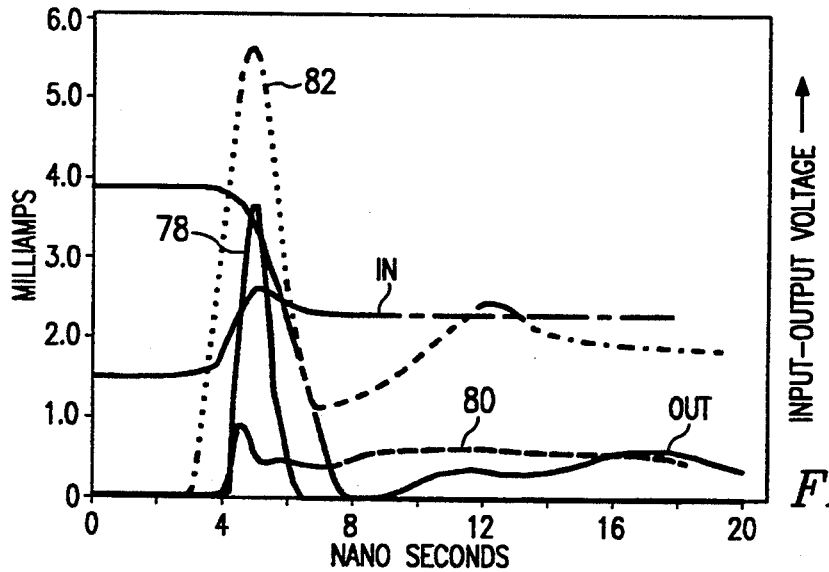
FIG. 3 illustrates a graphical depiction of current levels at various nodes during an output high-to-low transition.

A preferred embodiment of the present invention is best understood by referring to FIGS. 1-3 of the drawings, like numerals being used for like corresponding parts of the various drawings.

FIG. 1 illustrates a schematic representation of the prior art TTL gate with a Darlington output, generally referred to by reference numeral 10. The TTL gate 10 receives an input signal (IN) and produces an output signal (OUT) which tracks the IN signal. During a low-to-high transition of IN signal, the OUT signal will transition from high-to-low also. It is understood that more complex gates can be formed using TTL technology, and that the TTL gate 10 illustrated in FIG. 1 is just one example thereof.

TTL gate 10 comprises an NPN input transistor 12 and three NPN output transistors 14, 14A and 16. Input transistor 12 is also known as a phase splitter; the current at the emitter of transistor 12 is in-phase with that of the IN signal and the voltage at the collector is out-of-phase with that of the IN signal. The IN signal is coupled to the base of the phase splitter 12, the bases of the upper output Darlington transistors 14A and 14 are coupled to the collector of the phase splitter, and the base of output transistor (lower output transistor) 16 is coupled to the emitter of phase splitter 12. The emitter of upper output Darlington transistor 14 is coupled to the collector of lower output transistor 16 and this node generates the OUT signal of the TTL gate. The emitter of lower output transistor 16 is coupled to ground and the emitter of phase splitter 12 is coupled to ground through a resistor 18. The collector of upper output Darlington transistors 14 and 14A are coupled to a voltage source $V_{CC}$ through resistor 20 and the collector of phase splitter 12 is coupled to $V_{CC}$ through resistor 22. Resistor 23 is connected from the base of transistor 14 to the emitter of transistor 14.

In operation, phase splitter 12 receives the IN signal at its base. If input signal IN makes a transition from high-to-low, upper output Darlington transistors 14 and 14A turn on and provide a large current to rapidly charge capacitances at the input of the next gate. When IN signal makes a transition from low-to-high, upper output Darlington transistors 14 and 14A turn off and lower output transistor 16 turns on, providing a low impedance discharge path for the output capacitances.

A more rapid "push-pull" switching action can be made to take place if phase splitter transistor 12 can be made to turn on and off more rapidly. In one embodiment of the prior art, the anode of a diode 24 is connected to the output node OUT and the cathode is connected to the collector of phase splitter 12. Diode 24 provides a path for output current to flow back into phase splitter 12, thereby driving the phase splitter transistor 12 harder and decreasing its switching time.

FIG. 2 illustrates the TTL gate 26 of the preferred embodiment of the present invention. TTL gate 26 comprises a phase splitter 12, upper and lower output transistors 14, 14A and 16, resistors 18, 20, 22 and 23, as discussed in connection with FIG. 1, and also includes three speedup circuits 28, 30 and 32 coupled to phase splitter 12.

First speedup circuit 28 comprises a switching element, comprising a Schottky transistor 34 and a charging element 36. In the preferred embodiment, the switching transistor 34 is associated with an added capacitive element fabricated with resistor 42 located at the base of switching transistor 34, and charging element 36 comprises a Schottky diode. The emitter of transistor 34 is coupled to the collector of phase splitter 12 and the base of transistor 34 is coupled to the cathode of charging diode 36. The anode of charging diode 36 is coupled to current source 38. Resister 40 is coupled between the collector of transistor 34 and a voltage source $V_s$; resistor 42 is coupled between the base of transistor 34 and voltage source $V_s$.

Second speedup circuit 30 comprises a switching element 44, a capacitive element 46 and timing circuitry 48. Timing circuitry 48 comprises a resistor 50 and a capacitive element 52 which comprises two Schottky diodes 54 and 56. In the preferred embodiment, switching element 44 comprises an NPN Schottky transistor, the emitter of which is coupled to the collector of phase splitter 12. Capacitive element 46 comprises a Schottky diode, the cathode of which is coupled to voltage source $V_s$ and the anode of which is coupled to the collector of switching transistor 44. The anode of diode 54 is coupled to the cathode of diode 56, and resistor 50 is coupled between the base of switching transistor 44 and the cathode of diode 56. The anode of diode 56 is coupled to the collector of phase splitter 12 and the cathode of diode 54 is coupled to voltage source $V_s$. Resistor 58 is coupled between the collector of switching transistor 44 and voltage source $V_s$.

The third speedup circuit 32 comprises a capacitive element 60 which, in the preferred embodiment, comprises a Schottky diode. The anode of diode 60 is coupled to ground and the cathode of diode 60 is coupled to the collector of phase splitter 12.

First speedup circuit 28 comprises additional circuitry to decrease the gate switching time during an output transition from a high impedance state to a low logic level. This additional circuitry comprises switching element 62, switching element 64 and resistor 66. In the preferred embodiment, switching element 62 comprises a Schottky diode and switching element 64 comprises an NPN Schottky transistor. The cathode of diode 62 is coupled to the 3-state input of the gate and the anode of diode 62 is coupled to the base of transistor 64. The collector of transistor 64 is coupled to the base of transistor 34 and the emitter of transistor 64 is coupled to the anode of diode 68. Resistor 66 is connected between the base of transistor 64 and voltage source $V_s$. Resistor 70 is connected between the anode of diode 72 and the cathode of diode 68 and further coupled to the base of output transistor 14. The cathode of diode 72 is coupled to the emitter of output transistor 14

The anode of diode 74 is coupled to the base of output transistor 14 and the cathode of diode 74 is coupled to the 3-state input. The anode of diode 76 is coupled to the base of output transistor 14 and the cathode of diode 76 is coupled to the collector of phase splitter 12.

FIG. 3 illustrates the voltage and current at various nodes in the circuit as a function of time. As IN signal makes a transition from a low logic state to a high logic state, OUT signal makes a transition from a high logic state to a low logic state. Current 78 is the current from first speedup circuit 28 and current 80 is the current from second speedup circuit 30. Current 82 is the current flowing into phase splitter 12 and represents the sum of current 78 from the first speedup circuit 28, current 80 from second speedup circuit 30 and the current from the third speedup circuit 32 (not shown).

In operation, first speedup circuit 28 provides a large, but short duration, current 78 to the collector of phase splitter 12 responsive to a high-to-low output transition. Simultaneously, second speedup circuit 30 provides a timed current 80 to the collector of phase splitter 12. Second speedup current 80 is of lower magnitude but longer duration than first speedup current 78. Second speedup circuit 30 also contains a timing circuit 48 which turns off second speedup current 80 after it is no longer needed in order to prevent excessive power consumption.

Simultaneously with the operation of first and second speedup circuits 28 and 30, third speedup circuit 32 provides additional current to the collector of phase splitter 12. The sum 82 of these speedup currents enables phase splitter 12 to turn on lower output transistor 16 very rapidly, enabling OUT signal to make a rapid transition from a high to low logic state.

First speedup circuit 28 provides an impulse-like current to phase splitter 12 as follows. During the high-to-low output transition, when the voltage at the collector of phase splitter 12 falls below the voltage at the base of transistor 34 by an amount equal to the potential between the base and emitter of the transistor ($V_{BE}$), the capacitor formed by resistor 42 discharges a current 78 through phase splitter 12 into output transistor 16. This current continues until the resistor 42 capacitance is fully discharged or until transistor 34 is turned off, which occurs when the OUT signal "pulls down" the circuit chain of diode 72, resistor 70, diode 68, and switching transistor 64. The collector of transistor 64 is coupled to the base of transistor 34 which turns off when OUT signal is low.

When OUT signal is in the high logic state, current flows through diode 36 to charge the capacitance of resistor 42 at the base of transistor 34, preparing it for the next high-to-low output transition.

Second speedup circuit 30 provides a timed current to phase splitter 12 as follows. When OUT signal is in a high logic state, diode 46 stores a charge across its anode-cathode junction. Simultaneously, capacitive element 52, comprising two diodes 54 and 56, also charges. When the voltage at the collector of phase splitter 12 falls below the voltage at the base of transistor 44 by an amount equal to $V_{BE}$, transistor 44 is turned on allowing diode 46 to discharge current 80 through phase splitter 12. The capacitive values of diodes 54 and 56 and the resistive value of resistor 50 are selected such that transistor 44 turns off after a desired time period. Thus, the current provided by the speedup circuit 30 may be tailored to provide a fast output transistion without excessive power consumption.

Third speedup circuit 32 provides a current to phase splitter 12 as follows. A charge is stored across diode 60, acting as a capacitor, while the OUT signal is in a high logic state and current is discharged through phase splitter 12 when OUT signal makes a transition to the low logic state.

Speedup circuit 28 is also operable to decrease the switching time during the output transition from a high impedance state (3-state), in which both output transistors 14 and 16 are off, to a low logic state. When OUT signal is in a high impedance state, the 3-state input level is low and transistor 64 in first speedup circuit 28 is off. Consequently, the voltage level at the collector of transistor 64 (and the base of transistor 34) is at a high voltage level and the resistor 42 capacitor on the base of transistor 34 becomes charged. As OUT signal begins to make the transition to a low logic level, the voltage at the collector of phase splitter 12 falls by $V_{BE}$ below the voltage level at the base of transistor 34 and diode 62 discharges from the base to collector of transistor 64 as well as the resistor 42 capacitance discharging into the base of transistor 34 allowing transistor 34 to discharge a current through phase splitter 12.

Although the present invention has been described in detail, it should be understood that various changes, substitutions and alterations can be made herein without departing from the spirit and scope of the invention as defined by the appended claims.

What is claimed is:

1. An output circuit buffer for providing a fast output transition responsive to an input transition comprising:
   an output circuit operable to switch output states responsive to the input transition, said output circuit comprising a phase splitter transistor for receiving the input and an output driving transistor coupled to said phase splitter transistor;
   a first speedup circuit for generating an impulse-like current of high magnitude and short duration for driving said output circuit by driving current into the collector of said phase splitter transistor responsive to the input transition; and
   a second speedup circuit for generating a timed current for driving said output circuit by driving additional current into the collector of said phase splitter transistor responsive to the input transition.

2. The circuit of claim 1 and further comprising a third speedup circuit for generating a current for driving said output circuit by driving additional current into the collector of said phase splitter transistor responsive to the input transition.

3. The circuit of claim 2 wherein said first speedup circuit comprises:
   a capacitive element connected to said phase splitter transistor, said capacitive element operable to discharge said impulse-like current through the collector of said phase splitter transistor; and
   a charging element coupled to said capacitive element operable to charge said capacitive element, said charging element storing charge when said output is in the high logic state.

4. The circuit of claim 3 wherein said capacitive element comprises the base-emitter junction of an NPN transistor having an emitter, base, and collector.

5. The circuit of claim 4 wherein said emitter is coupled to said phase splitter transistor, said base is coupled to said charging element and said collector is coupled to a voltage source.

6. The circuit of claim 4 wherein said transistor is capable of being switched off when said NPN output circuit is in the low logic state.

7. The circuit of claim 3 wherein said charging element comprises a Schottky diode having an anode and cathode.

8. The circuit of claim 7 wherein said anode is coupled to a current source and said cathode is coupled to the second node of said capacitive element.

9. The circuit of claim 2 wherein said second speedup circuit comprises:
   a capacitive element operable to store a charge while the output circuit is in a high logic state and discharge said charge through the collector of said phase splitter transistor when the output circuit changes to a low logic state;
   switching circuitry having first, second and third nodes and operable to discharge said capacitive element coupled to said first node responsive to a signal at said first node; and
   a timing element having an output coupled to said third node of said switching circuitry operable to turn said switching circuitry off.

10. The circuit of claim 9 wherein said capacitive element comprises a Schottky diode having an anode and cathode.

11. The circuit of claim 10 wherein said anode is coupled to said first node and said cathode is coupled to a voltage source.

12. The circuit of claim 9 wherein said switching circuitry comprises an NPN transistor having a collector, emitter and base.

13. The circuit of claim 12 wherein said collector is coupled to said first node, said emitter is coupled to said second node and said base is coupled to said third node.

14. The circuit of claim 9 wherein said timing element comprises a capacitive element and a resistive element.

15. The circuit of claim 14 wherein said capacitive element comprises first and second Schottky diodes each having an anode and a cathode and said resistive element comprises a resistor.

16. The circuit of claim 15 wherein said anode of said first diode is coupled to said cathode of said second diode, said cathode of said first diode is coupled to a voltage source, said anode of said second diode is coupled to said phase splitter transistor, and said resistor is coupled between said anode of said first diode and said third node of said switching element.

17. The circuit of claim 2 wherein said third speedup circuit comprises a Schottky diode having an anode and cathode.

18. The circuit of claim 17 wherein said anode is coupled to electrical ground and said cathode is coupled to said phase splitter transistor.

19. The circuit of claim 2 wherein said phase splitter transistor comprises an NPN transistor having a base, emitter, and collector.

20. The circuit of claim 19 wherein said base is coupled to the input, said emitter is coupled to said output driving transistor, and said collector is coupled to said first, second and third speedup circuits.

21. An output buffer circuit for providing a fast output transition from a high impedance state to a low logic level state responsive to an input transition on a 3-state input comprising:
said 3-state input;
an output circuit comprising a phase splitter transistor coupled to an output driving transistor, said output driving transistor operable to switch output states from a high impedance state to a low logic level state responsive to a transition on said 3-state input; and
a speed up circuit for generating an impulse-like current for driving said output circuit responsive to said 3-state input transition by providing additional current to the collector of said phase-splitter transistor.

22. The circuit of claim 19 wherein said speedup circuit comprises:
a first capacitive element operable to store a charge when said 3-state input is low and discharge said charge when said 3-state input changes to a high;
switching circuitry responsive to said first capacitive element; and
a second capacitive element responsive to said switching circuitry and operable to discharge a current through said phase splitter transistor.

23. The circuit of claim 22 wherein said switching circuitry comprises an NPN transistor having a base, emitter, and collector.

24. The circuit of claim 23 wherein said first capacitive element comprises a Schottky diode having an anode and cathode.

25. The circuit of claim 24 wherein said anode is coupled to said 3-state input and said cathode is coupled to said base of said switching transistor.

26. The circuit of claim 22 wherein said second capacitive element comprises the resistor associated capacitance coupled to an NPN transistor having a base, emitter, and collector.

27. The circuit of claim 26 wherein said base of said NPN transistor is coupled to said collector of said switching transistor, said emitter of said NPN transistor is coupled to said phase splitter, and said collector of said NPN transistor is coupled to a voltage source.

28. The circuit of claim 21 wherein said phase splitter transistor comprises an NPN transistor having a base, emitter, and collector.

29. The circuit of claim 28 wherein said base is coupled to an input, said emitter is coupled to said output circuit, and said collector is coupled to said speedup circuit.

30. A method of providing a fast output transition from a high logic level to a low logic level responsive to an input transition from low to high, comprising the steps of:
Providing an output circuit having a phase splitter transistor for receiving the input and having an output driver transistor coupled to said phase splitter transistor;
generating a first current of high magnitude and short duration for driving the output responsive to the input transition by applying additional current into the collector of said phase splitter transistor; and
generating a second, timed current for driving said output responsive to said input transition by applying said second timed current to the collector of said phase splitter transistor.

31. The method of claim 30 and further comprising the stop of generating a third current for driving said output responsive to said input transition by applying said third current to the collector of said phase splitter transistor.

32. The method of claim 30 wherein said step of generating said first current comprises the steps of:
storing a charge in a capacitive element while said output is in a high logic state; and
discharging said capacitive element into said output responsive to a high-to-low output transition.

33. The method of claim 32 wherein said step of storing a charge in said capacitive element comprises the step of storing a charge at the base of an NPN transistor.

34. The method of claim 33 wherein said step of discharging said capacitive element comprises the step of reducing the voltage at the emitter of said transistor responsive to said high-to-low output transition enabling said transistor.

35. The method of claim 30 wherein said step of generating said second current comprises the steps of:
storing a charge in a capacitive element while said output is at a high logic state;
enabling switching circuitry to discharge said capacitive element responsive to said output high-to-low transition; and
disabling said switching circuitry following a predetermined time.

36. The method of claims 35 wherein said step of storing a charge in said capacitive element comprises the step of storing a charge in the junction of a Schottky diode.

37. The method of claim 35 wherein said step of enabling said switching circuitry comprises the step of turning on an NPN transistor responsive to said output high-to-low transition, 38. The method of claim 35 wherein said step of disabling said switching circuitry comprises the step of the complete discharge of a second capacitive element, 39. The method of claim 31 wherein said step of generating said third current comprises the steps of:
storing a charge in a capacitive element while the output is in the high logic state; and
discharging said capacitive element responsive to said output high-to-low transition.

40. The method of claim 39 wherein said step of storing a charge in said capacitive element comprises storing of a charge in a Schottky diode.

41. The method of claim 40 wherein said step of discharging said capacitive element comprises the step of reducing the voltage at the cathode of said diode responsive to said output high-to-low transition enabling said diode to discharge.

42. A method of providing a fast output transition from a high impedance state to a low logic level state responsive to an 3-state input transition, comprising the steps of:

providing an output circuit having a phase splitter transistor coupled to said 3-state input and an output driver transistor coupled to said phase splitter transistor; and generating a current of high magnitude and short duration for driving said output responsive to a transition in the 3-state input from a high logic level to a low logic level, by causing said current to be applied to the collector of said phase splitter transistor.

43. The method of claim 42 wherein said step of generating said current comprises the steps of:

storing a charge in a capacitive element when said 3-state input is at a low level;

enabling switching circuitry responsive to said first capacitive element; and discharging a second capacitive element responsive to said switching circuitry.

44. The method of claim 42 wherein said step of storing a charge in said first capacitive element comprises the step of storing the charge in the junction of a Schottky diode.

45. The method of claim 42 wherein said step of enabling said switching circuitry comprises the step of turning on an NPN transistor.

46. The method of claim 43 wherein said step of discharging said second capacitive element comprises the step of discharging the junction of a Schottky diode.

* * * * *